United States Patent

Neale

[15] 3,675,090

[45] *July 4, 1972

[54] FILM DEPOSITED SEMICONDUCTOR DEVICES

[72] Inventor: Ronald G. Neale, Birmingham, Mich.

[73] Assignee: Energy Conversion Devices, Inc., Troy, Mich.

[ * ] Notice: The portion of the term of this patent subsequent to Oct. 5, 1988, has been disclaimed.

[22] Filed: Oct. 17, 1969

[21] Appl. No.: 867,341

Related U.S. Application Data

[63] Continuation-in-part of Ser. Nos. 773,013, Nov. 4, 1968, and Ser. No. 806,994, March 13, 1969.

[52] U.S. Cl. ........................317/234 R, 29/569, 317/234 M, 317/234 N, 317/234 V, 317/235 F

[51] Int. Cl. ........................................H01l 3/00, H01l 19/00

[58] Field of Search .......................317/234 V, 235 P, 235 K; 338/20

[56] References Cited

UNITED STATES PATENTS

| | | | |
|---|---|---|---|
| 3,271,591 | 9/1966 | Ovshinsky | 317/237 X |
| 3,409,809 | 11/1968 | Diehl | 317/235 |
| 3,418,619 | 12/1968 | Lighty | 317/237 X |
| 3,436,624 | 4/1969 | Wesemeyer | 317/237 |
| 3,480,843 | 11/1969 | Richardson | 317/234 |
| 3,519,901 | 7/1970 | Bean | 317/235 |
| 3,581,166 | 5/1971 | Suzuoka | 317/234 X |

*Primary Examiner*—John W. Huckert
*Assistant Examiner*—William D. Larkins
*Attorney*—Wallenstein, Spangenberg, Hattis & Strampel and Edward G. Fiorito

[57] ABSTRACT

A film of semiconductor material is deposited within a pore formed in a layer of insulating material to make electrical contact with an electrode-forming layer on both sides of the semiconductor material with at least one side of the semiconductor material having an effective contact area limited by the size of the pore to define a limited volume of such semiconductor material through which current can flow.

26 Claims, 23 Drawing Figures

Inventor
Ronald G. Neale
By: Wallenstein, Spangenberg, Hattis & Strampel attys.

Inventor
Ronald G. Neale
By: Wallenstein, Spangenberg, Hattis & Strampel
attys

Inventor
Ronald G. Neale
By: Wallenstein, Spangenberg, Hattis & Strampel Attys.

FILM DEPOSITED SEMICONDUCTOR DEVICES

This is a continuation-in-part of my applications, Ser. Nos. 773,013, filed Nov. 4, 1968 and 806,994, filed Mar. 13, 1969.

This invention relates generally to film deposited electronic components, and has its most important application in film deposited semiconductor switch devices like those disclosed in U.S. Pat. No. 3,271,591 issued Sept. 6, 1966. In the semiconductor threshold and memory switch devices, disclosed in said U.S. Pat. No. 3,271,591 and referred to therein as "mechanism" and "Hi-Lo"devices, respectively, the active semiconductor materials are substantially disordered and generally amorphous materials which, when a voltage equal to or greater than a threshold voltage value is applied across a pair of electrodes in contact with the active semiconductor material, a filamentous conductive path is formed therein to alter the portion of the material occupied by the path from an initially high resistance current blocking condition to a low resistance current conducting condition. In threshold switch devices the conducting condition of the device involved persists until the current therethrough is reduced below a given holding current value, and in the memory switch device the semiconductor material remains in a low resistance conducting condition even when the current and voltage applied thereto is interrupted. The latter semiconductor material is returned to a non-conductive state by application of a reset current thereto. An increase in voltage applied to a threshold or memory switch device increases the current therethrough and the low resistance of the device decreases to maintain a fairly constant voltage drop across the semiconductor material by the enlargement of the diameter of the filamentous path through which current flows in the material.

It is, of course, important to obtain switch devices with a very low leakage current in its high resistance condition and a fairly consistent threshold voltage value, and this has been found to be especially difficult to achieve prior to the unique constructions of the present invention. The threshold voltage values of these threshold and memory switch devices are principally determined by the thickness of the semiconductor material interposed between the electrodes in contact therewith. However, it has been found that significant variations in the threshold voltage values can occur in a given switch device. It is believed that this variation may be due to the formation of the filamentous current paths therein in widely different regions of the semiconductor material when it is switched at different times to the conducting condition thereof. In accordance with one of the aspects of the invention, each semiconductor switch device is fabricated so as to present a very small cross-sectional area of semiconductor material for current flow to minimize leakage current paths therethrough and so that filamentous current paths formed therein are located in about the same region of the semiconductor material each time the device is switched from its non-conductive to its conductive condition. This cross-sectional area is made about the diameter of the largest current path expected to be formed therein. For a threshold or memory switch device carrying a current of about 5 milliamps and semiconductor material thickness of about 1.2 microns, the preferred cross-sectional area of the semiconductor material available for current flow was that presented by about a 10 micron diameter cylindrical body of such material. Diameters up to about 40 microns have also been satisfactorily used for currents of about this magnitude. This small body of semiconductor material available for current flow is best achieved by depositing a layer of insulating material on a conductive surface forming one of the electrodes of the switch device, etching a small pore of the desired small diameter in the layer of insulating material and then depositing over the insulating layer the active semiconductor material so it extends into and at least partially fills the pore therein. A deposit of electrode-forming material is then made on the semiconductor material.

The electrode materials used for the threshold and memory switch devices described must be carefully selected to avoid contamination of the semiconductor materials referred to. Although aluminum is a highly effective current conductor for printed circuitry leading to these devices, it has been found to be a very unsatisfactory electrode-forming material therefor because aluminum migrates into the semiconductor materials when current flow is from an aluminum electrode into the active semiconductor material. Current flow in the opposite direction, i.e., from the semiconductor materials into the aluminum, does not cause such a migration of aluminum. This problem of aluminum migration is overcome by using refractory materials like molybdenum as the electrode-forming material of the switch devices, since molybdenum isolates the aluminum from the semiconductor material. The aforesaid threshold and memory semiconductor devices of U.S. Pat. No. 3,271,591 are inherently bi-directional devices, and when used as such, both electrodes thereof should be made of substantially amorphous refractory materials. Where the semiconductor materials are, as these materials, substantially disordered and generally amorphous semiconductor materials the refractory electrode-forming material should be deposited in a substantially amorphous state so it does not adversely affect the substantially disordered and generally amorphous condition of the semiconductor material. Substantially crystalline electrode-forming materials would tend to crystallize the desirably generally amorphous semiconductor materials when in direct contact therewith. (The expression "substantially amorphous" includes micro-crystalline materials which, using conventional spectographic equipment, do not indicate any crystalline structure.) Other refractory conductive materials such as substantially amorphous tantalum, niobium, tungsten, and refractory metal oxides, carbides and sulphides, may be substituted for the substantially amorphous molybdenum.

Where relatively thick deposits of semiconductor materials are to be utilized and such deposits extend outside of the aforesaid pores of the switch devices to form thick edges, the deposition of amorphous refractory metal electrode-forming coatings thereon, which can be applied easily only as very thin coatings (as in the case with molybdenum), may not satisfactorily cover the edges of the semiconductor layer and thus cannot effectively isolate an aluminum overcoating therefrom. This problem is overcome by utilizing a layer of insulating material in which the pore is formed of sufficient thickness that each pore is only partially filled with the active semiconductor material so there are no active thick edges of semiconductor material. In such case, any deposit of the electrode-forming material in the pore will isolate the semiconductor material from the aluminum overcoating.

When threshold and memory switch devices are deposited on integrated circuit-forming semiconductor substrates or the like and the bottom electrodes of the devices are used to make physical and electrical contact with semiconductor substrate materials like silicon, it has been found that molybdenum, or other similar electrode-forming material, makes a poor bond to the silicon semiconductor substrate. Aluminum, however, has been found to be an extremely good bonding material between refractory electrode-forming materials like molybdenum and the semiconductor substrate, provided oxidation of the upper side of the aluminum contacting the electrode-forming material can be minimized during the deposition thereof. Aluminum is a very readily oxidizable material, and it has been found to be difficult to deposit aluminum without the outer surface thereof becoming oxidized. Such oxidization would, of course, diminish the ability of the aluminum to conduct current between the overlying electrode and the substrate. One of the aspects of the invention is an improved construction of a film deposited switch device where the upper surface of the aluminum or other oxidized deposit on a semiconductor substrate does not form part of a current carrying interface.

The above and other features and advantages of this invention will be more fully realized and understood from the following detailed description when taken with the accompanying drawings wherein like reference numerals throughout the various views of the drawings are intended to designate similar elements or components. In the drawings.

Figures 1, 2, 3A, 3B, 3C, 3D, 3E, 3F, 3G, 3H, 3I, 3J, 4:
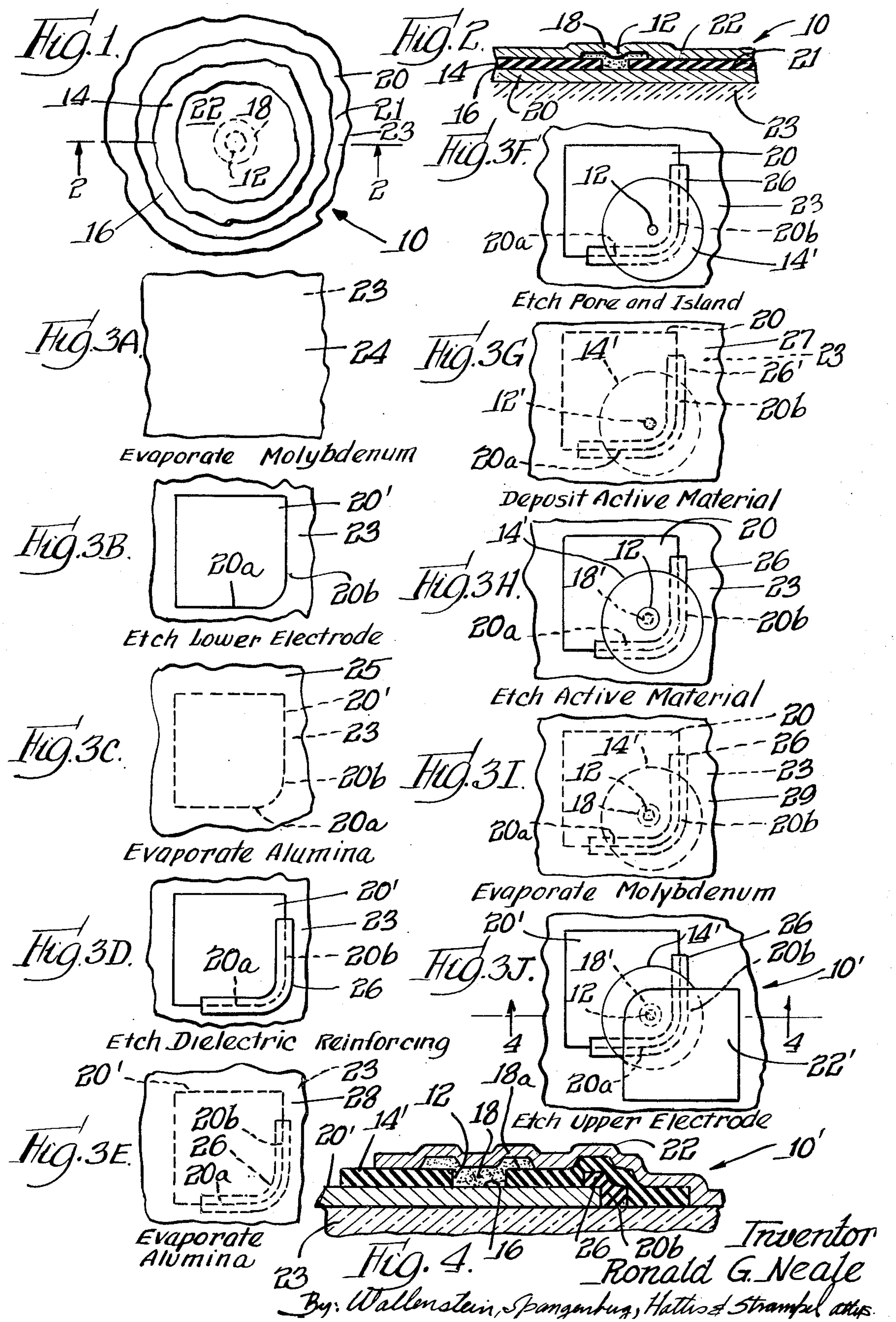
FIG. 1 is a fragmentary plan view showing a portion of a semiconductor switch device formed in accordance with this invention.
FIG. 2 is a sectional view of the switch device of FIG. 1, taken along section line 2—2 of FIG. 1.
FIG. 3A through 3J illustrates a series of steps used in forming a switch device similar to that shown in FIG. 2.
FIG. 4 is a sectional view taken along section line 4—4 of FIG. 3J.

Referring now to FIGS. 1 and 2, there is seen a semiconductor switch device 10 including a pore 12 formed in a layer 14 of insulating material which is preferably a deposit of insulating material formed on an electrode-forming surface 16. A deposit 18 of active semiconductor material extends into the pore 12 and fills at least the bottom portion thereof and makes electrical contact with the electrode-forming surface 16 over an area limited by the area of the pore 12. The electrode-forming surface 16 is the outer surface of a layer 20 most advantageously made of refractory conductive material like amorphous molybdenum, tantalum, niobium, tungsten, molybdenum carbide, vanadium sulphide, or other similar refractory metals or carbides, sulphides, or oxides thereof, deposited upon a surface 21 which in some cases may be an insulating layer or body 23 like glass and in other cases may be a conductive layer or body, like the electrode of an integrated circuit forming a diode or transistor in a silicon chip or the like. The semiconductor device 10 also has an upper electrode-forming layer 22 most advantageously of a refractory conductive material like molybdenum deposited over the semiconductor material 18 which generally extends over a portion of the insulating layer 14 to cover the deposit 18 of semiconductor material. Although the electrode-forming layer 22 overlaps the deposit 18 of semiconductor material, the useful or active portion of the semiconductor material is that portion within the pore. Although the thickness of the deposit of semiconductor material may vary widely for threshold or memory switch devices like that described in said U.S. Pat. No. 3,271,591, it would generally, as used in this invention, be from about 1 to 15 microns depending on the desired threshold voltage value. In any case, the current conducting path through the active semiconductor material is confined to a limited area defined by the pore 12, thus providing a more uniform current-voltage characteristic for each successive operation of the semiconductor device formed thereby. This limited area also provides a small leakage current path when the semiconductor switch device involved is in its high resistance condition.

One method of forming the pore structure semiconductor device 10′ similar to that shown in FIGS. 1 and 2 is illustrated by the series of diagrams of FIGS. 3A–3J. FIG. 4 is a sectional view taken along section line 4—4 of the finished semiconductor device 10′ shown in FIG. 3J. In FIG. 3A, a deposit 24 of a refractory electrode forming material, preferably molybdenum, is first deposited, as by sputtering or evaporating techniques, completely over an insulating substrate 23 such as glass or the like. Materials like molybdenum can be effectively deposited generally only in thin layers like about 1 mil. The electrode deposit is then etched to leave one or more limited areas of such material forming the bottom electrode 20′ of one or more switch devices 10′ (FIG. 3B). The advantage of this procedure is that one or more semiconductor devices 10′ can be formed on a single substrate 23. However, for purposes of simplicity, only one such semiconductor device 10′ is shown. The deposition of the electrode-forming material should, for reasons to be explained, be carried out under conditions which will deposit the same in a substantially amorphous condition. This is generally achieved when the temperature of the substrate is maintained at about room temperature or lower.

The etching process may be carried out through an out-of-contact mask positioned over the insulating deposit or, more preferably, by the application of a photosensitive resist material (not shown), selected areas of which are exposed through a film negative having the desired pattern of the areas to be etched to light on the desired mask-forming areas to render the same immune to chemicals well known in the art which discolor or etch away the unexposed areas thereof. Then the unexposed areas of the resist material are selectively removed with such chemicals. Another etching chemical is then applied over the substrate which only attacks the refractory electrode-forming material and not the fixed photosensitive resist material which is then removed by another chemical. (Whenever reference is hereafter made to the selective etching away of a coating, it will be assumed this is accomplished by the procedure just outlined above.)

In the embodiment shown in FIGS. 3A–3J, a layer of insulating material 25, preferably of alumina or the like, is deposited preferably over the entire substrate 23 (FIG. 3C) and then etched to form a dielectric reinforcing edge 26 (FIG. 3D) fully to cover the edge portions 20*a* and 20*b* of the electrode-forming layer 20. However, in some cases the dielectric reinforcing edge 26 may not be needed and, therefore, eliminated from the method shown in FIGS. 3A–3J. That is, where the thickness of the insulating material in and of itself is sufficient to cover the edge portions 20*a* and 20*b* of the electrode-forming layer 20 to prevent voltage break down between electrode-forming layers, then the dielectric reinforcing edge 27 is not needed.

After the reinforcing edge 26 is formed, a second layer 28 of insulating material is deposited over the entire body 23 (FIG. 3E). The layer 28, preferably which is also of alumina, is etched to form an insulating island 14′ having a pore 12 formed therein, here the pore 12 being substantially in the center of the island 14′.

Next, the previously treated substrate is coated with a layer 27 of active semiconductor material (FIG. 3G) so as to fill or partially fill the pore 12 and then selectively etched (FIG. 3H) to leave above the pore containing portion of each insulating island 14′ a small deposit 18 of active semiconductor material having portions 18a extending beyond the side walls of the pore 12. This is best seen in FIG. 4 which shows the deposit 18 of semiconductor material extending into the pore 12 to be in good electrical contact with the electrode forming surface 16 and which further shows the portions 18a extending radially outwardly of the pore 12 on top of the island 14′.

After deposition of the active semiconductor material and the etching thereof as described, an upper electrode-forming layer 29, (FIG. 3I) preferably of substantially amorphous molybdenum or other similar conductive refractory material, is formed by first depositing over the entire previously treated substrate a conductive substantially amorphous refractory material which is preferably the same type of refractory material which forms the bottom electrode-forming layer 20, and then selectively etching the layer 29 leaving an upper electrode 22 of the desired shape on top of each insulating island 14′ (FIG. 3J). The various depositing operations referred to above can be carried out using well-known evaporating or sputtering techniques.

In most cases, the active semiconductor material will be a substantially disordered and generally amorphous material like that disclosed in said U.S. Pat. No. 3,271,591. As previously indicated, when aluminum is to form an electrode in direct contact with the active semiconductor material, the latter can become contaminated by migration of the aluminum into the semiconductor material when (positive) current passes from the aluminum into the semiconductor material. Refractory materials like molybdenum are relatively inert at the temperatures at which the switch devices are operated and so do not migrate readily into adjacent semiconductor materials with which they are in contact. These active semiconductor materials are also generally adversely effected by direct contact with electrode-forming materials which are macro-crystalline in character since this can modify the desirable substantially amorphous character of the semiconductor material. Since the bottom and upper electrode-forming layers 20 and 22 are made of an amorphous refractory material, it will not adversely affect the amorphous character of the semiconductor layer 18 and will isolate the same from any adjacent layers of aluminum which may be utilized as overlying or underlying current carrying conductors.

Figures 5, 6, 7, 10, 11:
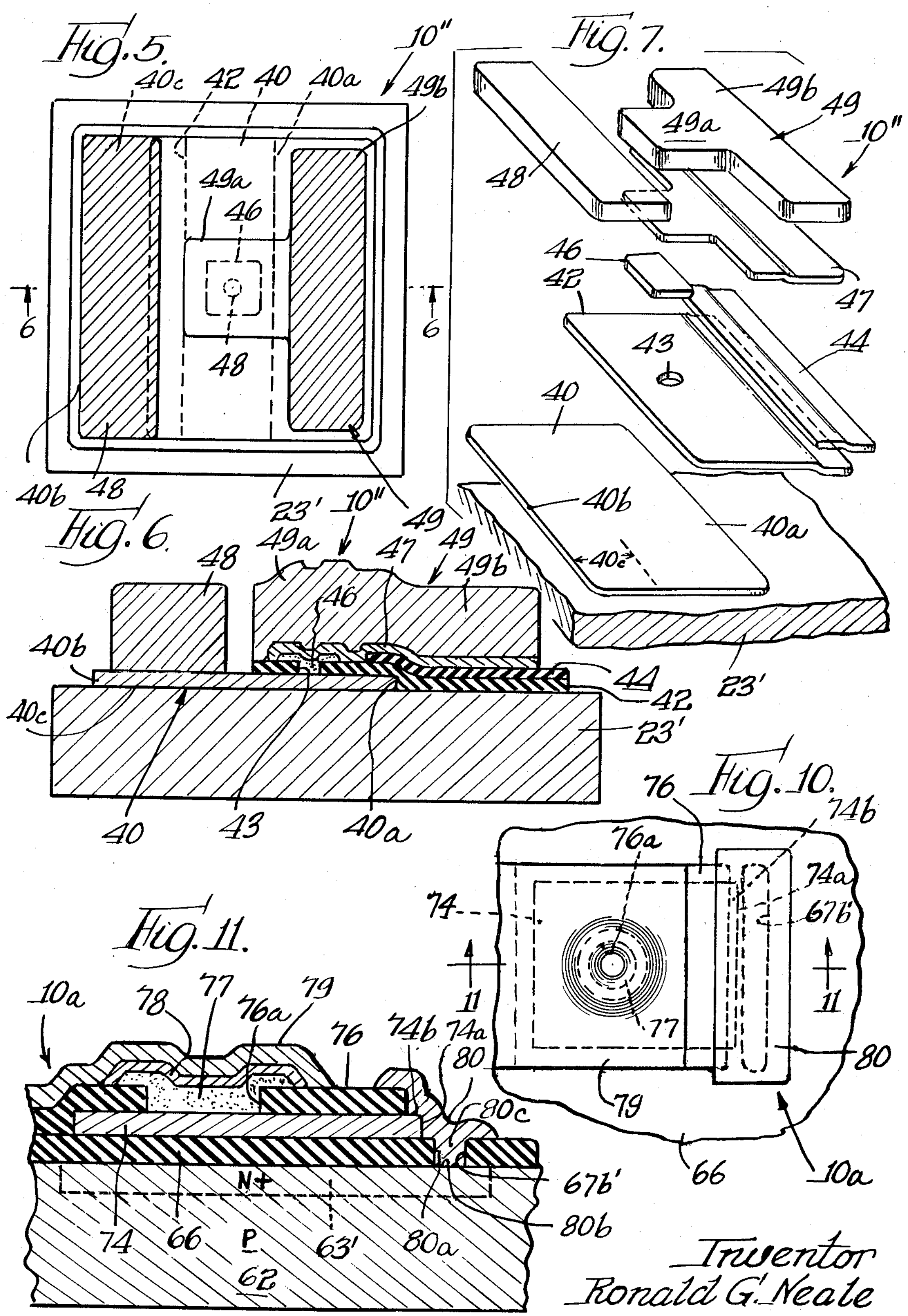
FIG. 5 is a plan view of a further modified construction of a switch device made in accordance with this invention.
FIG. 6 is a sectional view of the switch device of FIG. 5, taken along section line 6—6 therein.
FIG. 7 is an exploded view of the various layers making up the switch device of FIG. 5.
FIG. 10 is a plan view showing an alternate form of switch construction on an integrated circuit-forming substrate.
FIG. 11 is a side sectional view taken along section line 11—11 of FIG. 10.

The spaced apart bottom and upper electrodes 20 and 22 of the switch device 10' of FIG. 4 have the top surfaces thereof exposed for terminal connection at the top of the device so formed. Since materials like molybdenum are not very good conductors when used as thin layers as disclosed herein, a highly conductive material like aluminum may be deposited on the top of each surface of the electrodes 20 and 22 such as in the case of the modified and improved switch device 10'' shown in FIGS. 5–7 to which reference should now be made. This switch has a bottom electrode-forming layer 40 of elongated rectangular shape formed on a substrate 23'. Over the electrode-forming layer 40 is formed a layer or island 42 of insulating material like alumina and of rectangular configuration and which has a pore 43 formed therein by any suitable etching process. The layer 42 of insulating material extends beyond one of the marginal edge portions **40*a* of the electrode-forming layer 40 and terminates short of the opposite marginal edge portion 40*b* so the upper surface of a portion 40*c* is fully exposed. Over the layer 42 of insulating material is formed a small area of active semiconductor material 46 which extends into the pore 43 and makes good mechanical and electrical contact with the surface of the electrode-forming layer 40 exposed by pore 43**.

As in the case of the previously described switch device 10', where the layer 42 of insulating material does not fully cover the marginal edge portion **40*a* of the electrode-forming layer, it is desirable to include a dielectric reinforcing layer 44 fully to cover and insulate the marginal edge portion 40*a* of the electrode-forming layer 40, from an upper electrode-forming layer 47. Unlike the switch device 10', the reinforcing layer 44 is applied after the insulating layer 42. Terminal-forming conductive layers 48 and 49, preferably of aluminum or the like, are then formed upon the upper surface of the portion 40*c* of the bottom electrode-forming layer and on the upper electrode-forming layer 47, respectively. Preferably, the terminal-forming layer 49 overlying the upper electrode-forming layer 47 is a T-shaped layer including a tab-like portion 49*a* extending over the active semiconductor material 46 and a wide head portion 49*b* to provide an extensive area for soldering or otherwise connecting an external lead. The upper electrode-forming layer 47 is, likewise, a T-shaped layer coextensive with the overlying T-shaped terminal-forming layer 49. The terminal-forming layer 48 has an elongated rectangular shape and is about the same size as the head portion 49b of the terminal-forming layer 49**.

Exemplary dimensions for the switch device 10'' are:

| | |
|---|---|
| size of memory devices | 5–50 microns wide |
| size occupied by diode | 25–130 microns wide |
| area occupied by transistors | 25×5 microns to 150×200 microns |
| thickness of aluminum deposits | 1–5 microns |
| thickness of molybdenum layers | 0.3–1 microns |
| thickness of insulation layer | 1–2 microns |
| thickness of memory semiconductor material | 0.5–1 microns |

Figures 8, 9:
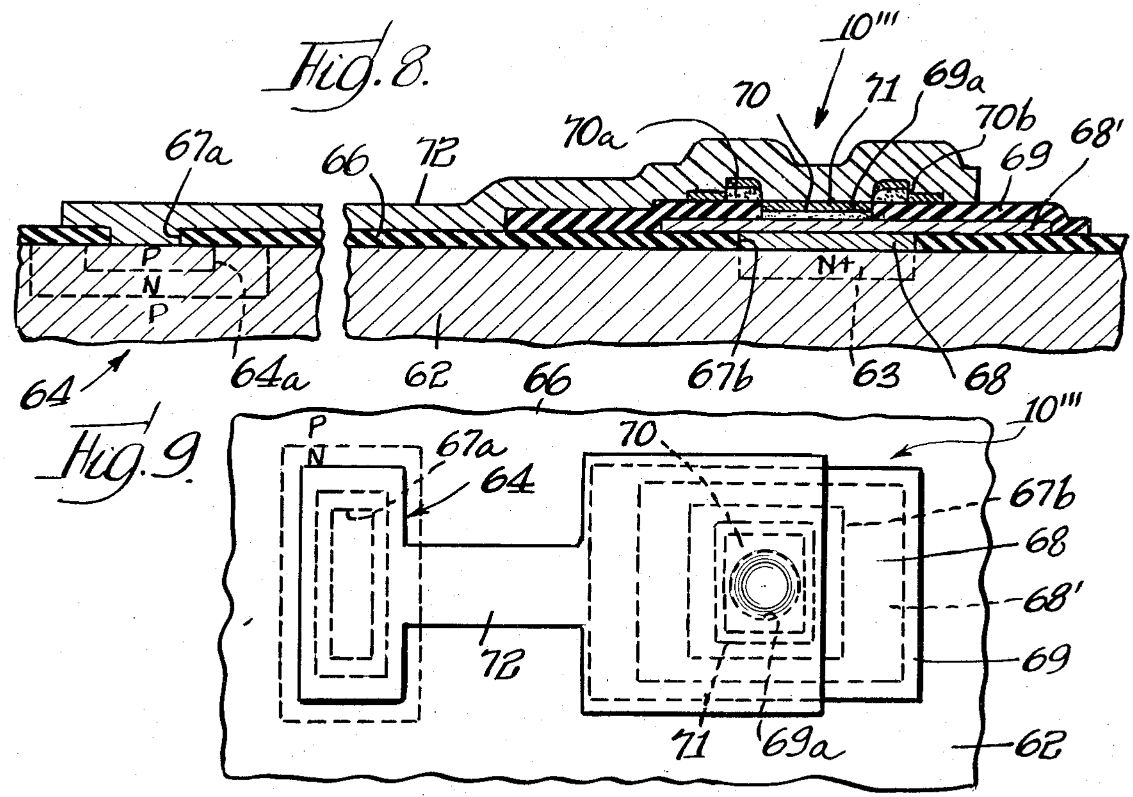
FIG. 8 is a sectional view through an integrated circuit-forming substrate with a switch device of the invention deposited therein.
FIG. 9 is a plan view of the substrate of FIG. 8 showing the improved deposited switch device construction.

The switch devices 10' and 10'' previously described, are deposited on a substrate like glass, and are designed to have external connections thereto made from the top thereof. For an application where the switch device is to be deposited on and make electrical connection with a silicon chip substrate or the like, and where the switch device involves a somewhat different construction, refer now to FIGS. 8 and 9 in which a deposited film switch device 10''' is formed on a doped silicon ship substrate 62 or the like which has formed immediately below the upper surface thereof a conductor 63 spaced and insulated from a transistor 64. The silicon ship illustrated in the drawings is a P conductivity type body where the conductor 63 is a N+ doped region. The semiconductor substrate 62, while it may be considered conductive for the purpose of transistor action of the semiconductor device 64, is substantially an insulator with respect to the adjacent N+ region 63. The substrate 62 has an insulating layer or oxide film 66 thereon in which is formed, by suitable etching processes, apertures or windows **67*a* and 67*b* to expose the upper P type doped region 64*a* of the transistor 64 and the N+ conductor-forming region 63, respectively. Within the window 67*b* is deposited a layer 68 of aluminum, or the like, which makes a good connection to the N+ bottom conductor 63. The switch device 10''' is then formed over the insulating film 66 and the aluminum filled window 67*b*** therein.

The switch device 10''' includes a bottom electrode-forming layer 68' of an amorphous refractory material like molybdenum which overlies the aluminum layer 68 and extends beyond the same over the insulating film 66. An insulating island 69 is applied over the electrode-forming layer 68', the insulating island having a pore **69*a* only partially filled with a thin layer of active semiconductor material 70 which is itself deposited as a thin layer around and into the pore 69*a*. The partial filling of the pore eliminates any connection of the active semiconductor material 70 within the pore 69*a* to that of the annular portion 70*a* outside the pore. Therefore, when an upper electrode-forming layer 71, preferably of molybdenum or the like, is deposited over the active semiconductor material as a relatively thin layer, of the electrode-forming material and does not cover the edges 70*b* of the semiconductor material, aluminum migration into the exposed edge portions of the annular portion 70*a*, if such migration does occur, will have no affect on the portion of active semiconductor within the pore 69*a*. In any event, the electrode-forming material covering the active portion of the semiconductor material within the pore completely isolates this portion of the semiconductor material from an overlayer 72 of aluminum. The aluminum overlayer 72 as illustrated extends to the transistor 64 through the window 67*a* to contact the exposed P electrode 64*a* of the transistor 64**.

The switch device 10''' presents a problem in fabrication because it is difficult to deposit aluminum in the windows **67*b* without the upper surface becoming oxidized which would, of course diminish the electrical conductivity of the contact between the aluminum and the electrode-forming layer 68' above the same. Thus, when it is desired to make electrical connection between the bottom electrode of a deposited semiconductor switch device and a substrate or other electrical element beneath the same, it is preferred to use the improved switch construction 10*a* of FIGS. 10 and 11. Here, an electrode-forming layer 74 of amorphous molybdenum, or the like, is formed over the insulating film 66 to one side of a film opening 67*b*' illustrated as being an elongated opening. A rectangularly shaped insulating island 76 with a pore 76*a* is then formed over the electrode-forming layer 74 so it terminates short of the edge 74*a* to expose an upper surface 74*b* thereof. A layer 77 of active semiconductor material is deposited onto the insulating island 76 in registry with the pore 76*a*** thereof to fill the pore (assuming that the relative thicknesses of the semiconductor and overlying electrode-forming layers 78 do not create any exposed edges requiring the partial pore filled construction of FIGS. 8 and 9) and to make good electrical connection with the portion of the electrode-forming layer 74 exposed by the pore 76a. Overlayers 79 and 80 of aluminum or other suitable conductive material are then deposited to be in contact with the exposed upper surfaces of the bottom and upper electrode-forming layers 74 and 78, the layer 80 extending into the elongated aperture 67b' to make electrical contact with the N+ region 63' in the substrate 62. The conductive layer 80 thus forms a body of conductive material 80c which bridges the space between the electrode forming layer 74 and the N+ region 63'. In this improved arrangement of this invention, the oxidization of the upper surface of the bridging layer 80 of conductive material will have no affect on the switch device so formed because there is no current carrying interface on the top of the layer 80. While reference has been made in connection with FIGS. 8 to 11 to N type and P type regions, these regions may be of opposite conductivity types than those illustrated and described.

Figure 12:
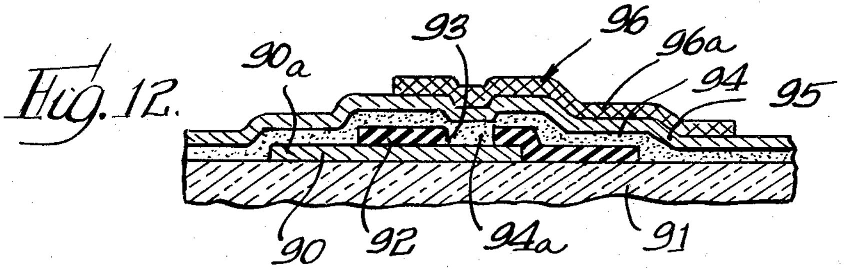
FIGS. 12-14 illustrate three steps in a unique process of making any of the switch devices of FIGS. 1, 2, 5–11.
Figure 13:
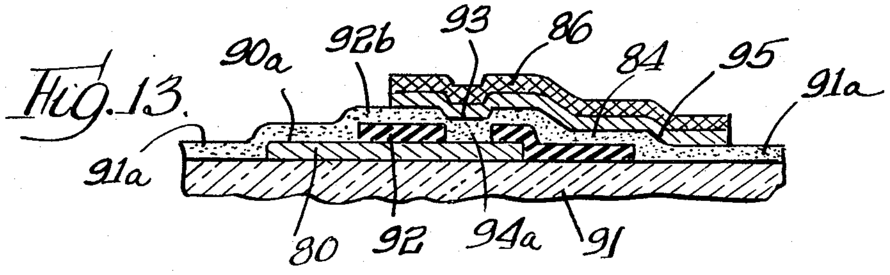
Figure 14:
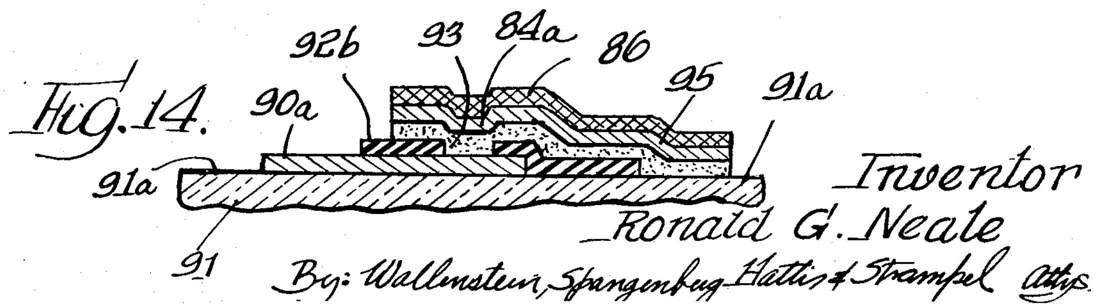

The methods of fabricating the semiconductor switch devices 10, 10', 10'' and 10''' as described hereinabove are for the most part, satisfactory and effective ways of obtaining switch devices of the desired electrical characteristics. However, great care must be taken to prevent contaminants from reaching the critical interfaces between the electrodes of the switch devices and the active semiconductor material. To overcome this problem, switch devices of the type disclosed herein may be fabricated as illustrated in FIGS. 12, 13, and 14. Here, as previously described, a bottom electrode 90 of amorphous molybdenum or the like, and an insulating island 92 with a pore 93 are formed on the substrate 91 in any suitable manner such as hereinabove described. (If the substrate 91 is to include a number of deposited switch devices then the desired pattern of electrodes 90 and insulating islands 92 of the switch devices are formed on the substrate.)

The resulting substrate is then placed in a vacuum system, preferably in a sputtering chamber where it becomes the cathode in an RF sputtering process where the exposed surfaces of the substrate are subject to ion bombardment to remove any contaminated surfaces of the substrate 91, bottom electrode 90 and insulating island 92. Then, without breaking the vacuum seal successive layers 94 and 95 of active semiconductor and electrode-forming materials are then evaporated or sputtered in over the entire substrate surface to fill or partially fill the pores 93 of all the switch devices involved with active semiconductor material and to cover the active semiconductor material with electrode-forming material. The critical interfaces between the semiconductor and electrode-forming materials are completely isolated from the surrounding environment and so the substrate can then be removed from the sputtering chamber. Next, a photoresist material is deposited over the entire surface of the electrode-forming layer and by suitable photographic techniques precise selected areas, such as the area 96a of the layer 96, are exposed to fix the photoresist material and it is those areas of the photo-resist material overlying the portions of the semiconductor and electrode-forming layers which are to form the switch device involved. The unexposed areas of the photoresist are then removed, leaving the substrate as shown in FIG. 12.

A selective etching process then follows using suitable chemicals or the like which act preferably first only on the electrode-forming material and then on the semiconductor material as illustrated in FIGS. 13 and 14 where those portions thereof not covered by the resist material are removed.

Accordingly, the several embodiments or pore structure semiconductive devices and methods of making the same disclosed herein have utility when used to form either a single device or a plurality of discrete devices on substrates which can be separated therefrom or used on such substrate to form complete integrated electronic circuits such as the matrix or the like It should be understood that numerous modifications may be made in the most preferred form of the invention described above without deviating from the broader aspects thereof.

I claim:

1. A film deposited semiconductor device comprising: a body of material having an insulating surface over which an electrode-forming material is deposited forming a bottom electrode-forming surface for the device, a deposit of insulating material over said electrode-forming surface and having a pore formed therein to expose a small area of the electrode-forming surface; a deposit of active semiconductor material capable of being altered between substantially conductive and nonconductive states and filling at least the inner portion of said pore to be in contact with said area of said electrode-forming surface; and a deposit of electrode-forming conductive material over said deposit of active semiconductor material and electrically contacting the same to form a second electrode for the semiconductor material, said layer of electrode-forming material having a raised edge over which said deposit of insulating material extends; said deposit of electrode-forming material forming said second electrode also overlying and extending beyond said deposit of insulating material at said raised edge of said layer; and a reinforcing layer of insulating material between said overlying deposit of electrode-forming material and said bottom layer of electrode-forming material and overlying said raised edge to cover and insulate the same, in conjunction with said deposit of insulating material, with at least about a double thickness of insulating material relative to the adjacent areas of the device covered only with said deposit of insulating material.

2. A film deposited semiconductor device comprising: a conductive electrode-forming surface; a deposit of insulating material over said electrode-forming surface and having a pore formed therein to expose a small area of the electrode-forming surface, a deposit of active substantially amorphous switch-forming semiconductor material capable of being altered between substantially conductive and nonconductive states and filling at least the inner portion of said pores to be in contact with said area of said electrode-forming surface and a deposit of electrode-forming conductive material over said deposit of active semiconductor material and electrically contacting the same to form a second electrode for the semiconductor material; and said second electrode and deposit of semiconductor material being of identical size, shape and position.

3. A film deposited semiconductor device comprising: a conductive electrode-forming surface; a deposit of insulating material over said electrode-forming surface and having a pore formed therein to expose a small area of the electrode-forming surface, active substantially amorphous switch-forming semiconductor material deposited in the pore of the insulating material and filling at least the inner portion of said pore to be in contact with said area of said electrode-forming surface and capable of being altered between substantially conductive and nonconductive states, and a deposit of electrode-forming conductive material over said deposit of active semiconductor material and electrically contacting the same to form a second electrode for the semiconductor material, and at least one of said electrode-forming surface and said deposit of electrode-forming conductive material being made of a substantially amorphous refractory material so as not to alter the amorphous condition of said active semiconductor material toward a crystalline condition.

4. The semiconductor device of claim 1 wherein said pore has a width of from about 5 to 40 microns.

5. The semiconductor device of claim 1 wherein said active semiconductor material is a deposit on and within the boundries of said deposit of insulating material and extends into said pore to at least partially fill the same.

6. The semiconductor device of claim 1 wherein both said electrode-forming surface and said deposit of electrode-forming conductive material are substantially amorphous refractory materials.

7. The semiconductor device of claim 1 wherein said semiconductor material is of generally high resistance for blocking current flow therethrough and wherein the portion of said semiconductor material altered to said conductive state comprises a filamentous path between the electrodes of the device which are formed in response to a voltage above a threshold voltage value applied across said material.

8. The semiconductor device of claim 7 wherein said filamentous path of low resistance reverts to a high resistance blocking condition when the current flow through the semiconductor material decreases below a minimum current value.

9. The semiconductor device of claim 1 wherein at least one of said electrode-forming surface and said deposit of electrode-forming material separates said active semiconductor material from a main current conductive layer of a non-refractory material which would otherwise adversely affect the deposit of active semiconductor material.

10. The semiconductor device of claim 3 wherein said refractory material is one material selected from the group consisting of tantalum, niobium, tungsten, molybdenum, and metallic oxides, carbides and sulphides.

11. The semiconductor device of claim 1 wherein each of said electrode-forming surface and deposit of electrode-forming material separates a different surface of said active semiconductor material from a main current conductive layer of a non-refractory conductive material which would otherwise adversely affect the deposit of active semiconductor material if in direct contact therewith, said at least one electrode-forming surface or deposit of electrode-forming material being a refractory conductive material.

12. The semiconductor device of claim 1 wherein said electrode-forming surface extends beyond said deposit of insulating material so a portion of the top surface thereof is exposed for terminal connection; and there are provided separate oxidized layers of conductive material respectively overlying said exposed portion of said electrode-forming surface and said deposit of electrode-forming material.

13. The semiconductor device of claim 12 wherein said layer of oxidized material covering said exposed portion of said electrode-forming surface extends beyond the same to make electrical contact on the bottom surface thereof with a circuit element externally of said semiconductor device.

14. The semiconductor device of claim 13 wherein said layer of oxidized material is a non-refractory metal, said electrode-forming surface is formed by a layer of a refractory material deposited on a semiconductor substrate, a portion of which substrate forms said circuit element and to which circuit element a portion of said layer of refractory material is to be coupled but to which it cannot make a secure connection when applied directly thereto, and said layer of oxidized material covering said exposed portion of electrode-forming surface extending to said circuit element forming portion of said substrate to make a secure electrical connection thereto.

15. The semiconductor device of claim 1 wherein said electrode-forming surface is formed by a layer of electrode-forming material having a portion extending beyond said deposit of insulating material; and there is provided a deposit of terminal-forming material overlying said portion of electrode-forming material.

16. The semiconductor device of claim 6 wherein said filamentous current path increases in size with the current involved and said pore has a size which is of an order of magnitude of the maximum cross-section of said filamentous path when current flow has its largest expected value.

17. The semiconductor device of claim 6 wherein said filamentous current path increases in size with the current involved and said pore has a size which is of an order of magnitude of the cross-section of said filamentous path.

18. The semiconductor device of claim 1 wherein said electrode-forming surface is a layer of such material deposited on a film of insulating material over a body of electrical circuit element-forming material, an opening in said insulating film exposing said body of electrical circuit element-forming material, and conductive means connecting said layer of electrode-forming material to said body of electrical circuit element-forming material through said opening.

19. The semiconductor device of claim 18 wherein said layer of electrode-forming material is a refractory material selected from the group consisting of tantalum, niobium, tungsten, molybdenum and metallic oxides, carbides and sulphides, and said conductive means is a deposit of a non-refractory conductive material.

20. The semiconductor device of claim 1 wherein there is provided an outer conductor which is to be kept out of direct physical contadt with said semiconductor material but which is to be electrically connected thereto, said deposit of active semiconductor material only partially fills said pore, and said deposit of electrode-forming conductive material forming said second electrode extends into said pore to make contact with said active semiconductor material within said pore and is overlaid by said outer conductor.

21. The semiconductor device of claim 20 wherein said outer conductor is aluminum.

22. The semiconductor device of claim 1 wherein both said conductive electrode-forming surface and said deposit of electrode forming conductive material are substantially amorphous refractory material, and there is provided over said deposit of electrode-forming amorphous refractory conductive material a main current conductive layer of a non-refractory material which would otherwise adversely affect the deposit of active semiconductor material if in direct contact therewith, said deposit of electrode-forming refractory amorphous conductive material acting as a conductive barrier between the main current conductive layer of non-refractory material and the active semiconductor material.

23. An integrated circuit comprising: a semiconductor substrate having a doped P-N junction portion and a conductive electrode-forming surface on said semiconductor substrate electrically connected to said P-N junction portion thereof; a deposit of insulating material on said electrode-forming surface and having a pore formed therein to expose a small area of the electrode-forming surface, a deposit of substantially amorphous active semiconductor switch-forming material capable of being altered between substantially conductive and nonconductive states and filling at least the inner portion of said pore to be in contact with the area of said conductive electrode-forming conductive material, and a deposit of electrode-forming conductive material over said deposit of active semiconductor material and electrically contacting the same to form a second electrode for the semiconductor material and at least one of said electrode-forming surface and said deposit of electrode-forming conductive material being made of a substantially amorphous refractory material so as not to alter the amorphous condition of said active semiconductor material toward a crystalline condition.

24. The integrated circuit of claim 23 wherein said semiconductor substrate has a film of insulating material thereon with an opening in said insulating film exposing said P-N junction portion thereof, said conductive electrode-forming surface electrically connected to said P-N junction portion of said semiconductor substrate through said opening in said film of insulating material, said deposit of insulating material having said pore being a deposit on said insulating film.

25. The integrated circuit of claim 24 wherein said pore formed in said deposit of insulating material is in alignment with said opening in said insulating film.

26. The integrated circuit of claim 24 wherein said deposit of insulating material is deposited over a limited area of said insulating film at a point spaced from said opening in said insulating film.

* * * * *